US006621741B2

(12) United States Patent
Yano

(10) Patent No.: US 6,621,741 B2
(45) Date of Patent: Sep. 16, 2003

(54) SYSTEM FOR PROGRAMMING VERIFICATION

(75) Inventor: Masaru Yano, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/062,283

(22) Filed: Jan. 30, 2002

(65) Prior Publication Data

US 2003/0142546 A1 Jul. 31, 2003

(51) Int. Cl.[7] .......................... G11C 16/04; G11C 16/06
(52) U.S. Cl. ............................. 365/185.22; 365/185.12
(58) Field of Search .................... 365/185.03, 185.05, 365/185.08, 185.12, 185.17, 185.19, 185.21, 185.22, 185.24, 185.29, 185.33

(56) References Cited

U.S. PATENT DOCUMENTS

| 5,751,637 | A | * | 5/1998 | Chen et al. | ............. 365/185.33 |
|---|---|---|---|---|---|
| 5,790,458 | A | * | 8/1998 | Lee et al. | ............. 365/185.21 |
| 5,862,074 | A | * | 1/1999 | Park | ............. 365/185.03 |
| 6,067,248 | A | * | 5/2000 | Yoo | ............. 365/185.03 |
| 6,181,605 | B1 | * | 1/2001 | Hollmer et al. | ........ 365/185.21 |
| 6,304,486 | B1 | * | 10/2001 | Yano | ............. 365/185.12 |

OTHER PUBLICATIONS

Iwata, et al., "A 35 ns Cycle Time 3.3 V Only 32 Mb NAND Flash EEPROM", *IEEE Journal*, Nov. 1995, 1157–1163, vol. 30, No. 11.

* cited by examiner

*Primary Examiner*—Trong Phan
(74) *Attorney, Agent, or Firm*—Sheppard Mullin Richter & Hampton LLP

(57) ABSTRACT

System for programming verification that intelligently reprograms failed bits without excessively stressing bit logic in the device. The system operates to detect bits that have failed a programming verify operation and to reprogram these bits with an adjusted programming voltage so as to obtain the desired Vt while reducing stress on the bits and achieving a narrow Vt distribution.

8 Claims, 4 Drawing Sheets

SYSTEM FOR PROGRAMMING VERIFICATION

FIELD OF THE INVENTION

The present invention relates generally to memory devices, and more particularly, to a system for programming verification of memory devices.

BACKGROUND OF THE INVENTION

The NAND type flash memory utilizes a storage architecture that is suitable for mass storage applications. Therefore, the device needs to have good reliability. However, the current NAND architecture cannot avoid generating wide voltage threshold (Vt) distributions because programming strength and time for each bit cannot be precisely controlled.

FIG. 1 shows a portion of a typical NAND memory device. As can be seen, every bit may have a different IR voltage drop with respect to an ARVSS line. Thus, when the chip goes to programming verify mode, some bits cannot pass the verify function even though every bit has received the same programming voltage. When bits fail to be programmed, the chip will return to the programming mode in an attempt to re-program and pass all the bits using a higher programming voltage. However, some bits may be overstressed by this process, and as a result, the device may be seriously damaged. Furthermore, such a programming technique results in a wide distribution of voltage thresholds.

Therefore, it would be desirable to have a way to program and verify a memory device without overstressing any bit logic and for achieving a narrow Vt distribution.

SUMMARY OF THE INVENTION

The present invention includes a system for programming verification that intelligently reprograms failed bits without excessively stressing bit logic in the device. For example, in one embodiment, the system operates to detect bits that have failed a programming verify operation and to reprogram these bits with an adjusted programming voltage so as to obtain the desired Vt while reducing stress on the bits and achieving a narrow Vt distribution.

In one embodiment of the invention, a method is provided for performing program verification of memory cells in a NAND memory device to achieve selected Vt levels. The NAND memory device includes page buffers having disable gates that operate to enable or disable programming of selected memory cells. The method includes the steps of: (a) performing a programming cycle to program the memory cells to have the selected Vt levels; (b) setting a first verification level; (c) verifying that the memory cells have the selected Vt levels using the first verification level, wherein passed and failed memory cells are determined; (d) inhibiting, using the disable gates, the passed memory cells from further programming; (e) setting a second verification level; (f) verifying that the failed memory cells have a second selected Vt level using the second verification level, wherein second passed and second failed memory cells are determined; (g) adjusting a programming pulse to have a first strength level when the second passed memory cells are determined; (h) adjusting the programming pulse to have a second strength level when the second failed memory cells are determined; (i) re-programming the failed memory cells with the programming pulse; and (j) repeating steps (b) through (i) until the memory cells have the selected Vt levels.

In another embodiment of the invention, apparatus is provided for performing program verification in a NAND memory device. The apparatus includes a page buffer coupled to a bit line, the page buffer including a latch coupled to a data input and the latch produces an inhibit signal. The apparatus also includes a programming disable gate coupled between the bit line and a grounding gate, the programming disable gate is further coupled to receive the inhibit signal, wherein when the inhibit signal is in a first state the programming gate couples the bit line to the grounding gate, and wherein when the inhibit signal is in a second state the programming gate decouples the bit line and the grounding gate.

BRIEF DESCRIPTION OF THE DRAWINGS

The foregoing aspects and the attendant advantages of this invention will become more readily apparent by reference to the following detailed description when taken in conjunction with the accompanying drawings wherein.

DETAILED DESCRIPTION OF THE INVENTION

The present invention includes a system for programming verification that intelligently reprograms failed bits in a memory device without excessively stressing bit logic in the device. One or more embodiments included in the present invention will now be described in detail in the following text and accompanying drawings.

Figure 1:
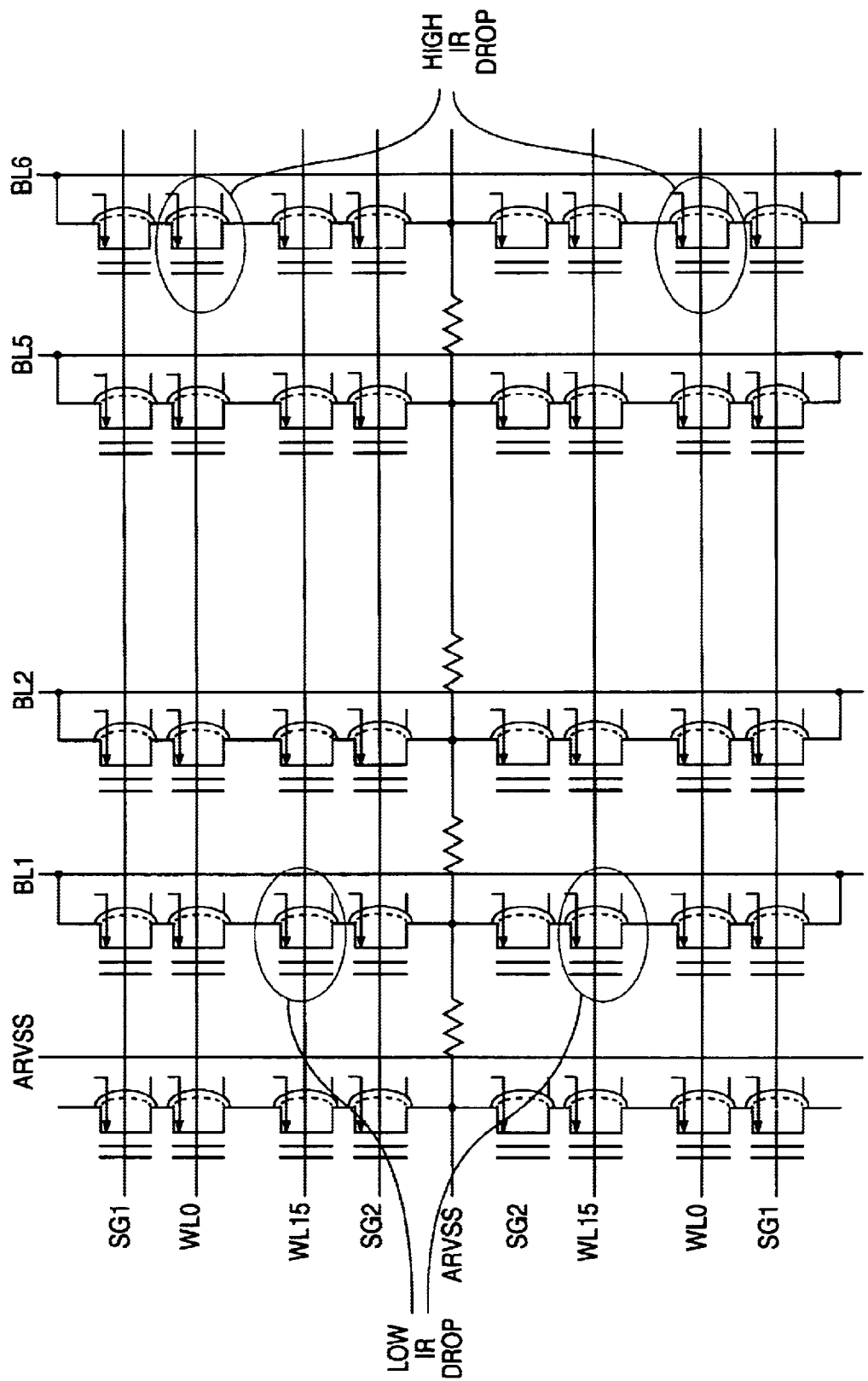
FIG. 1 shows a portion of a typical NAND memory device.
Figure 2:
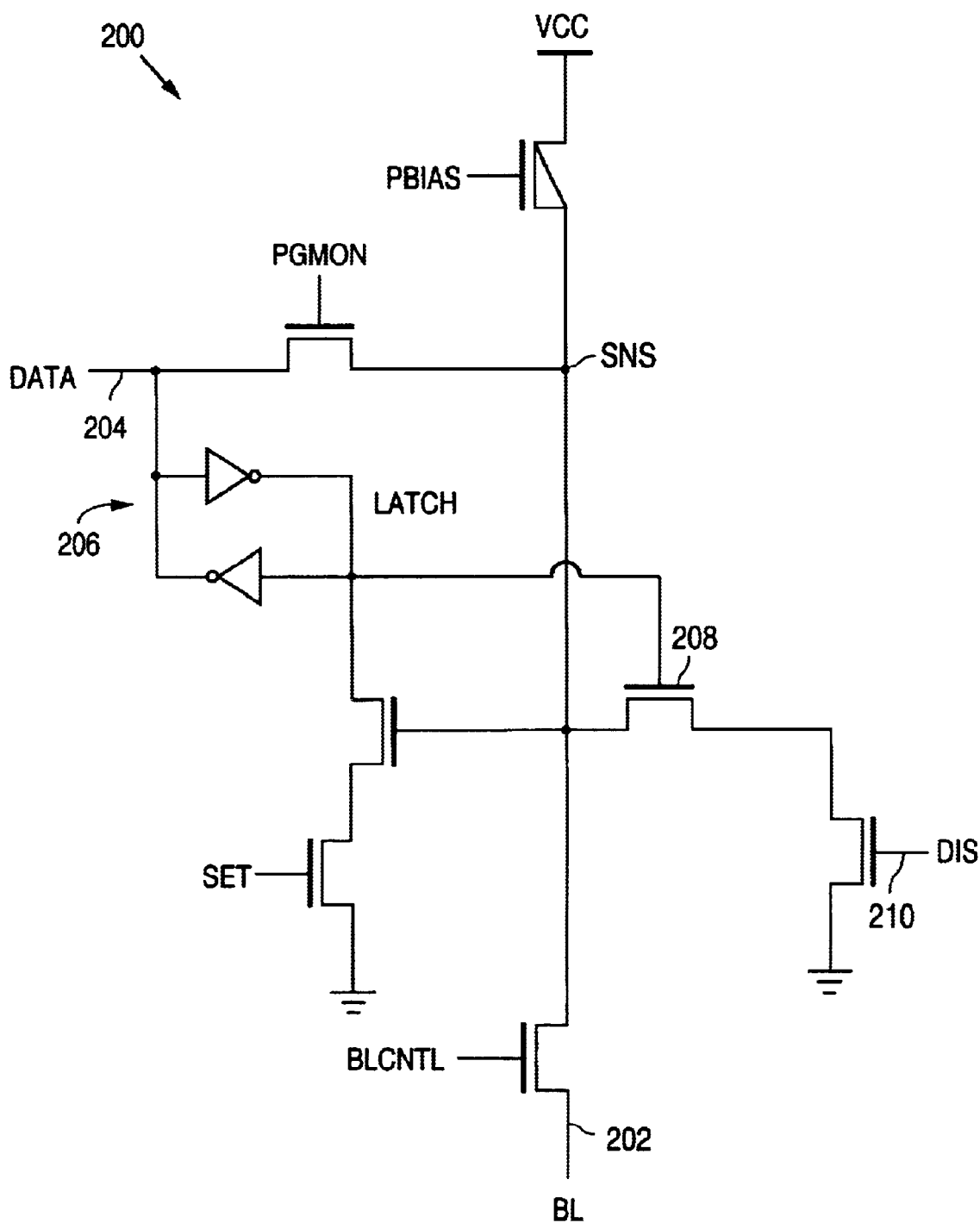
FIG. 2 shows an exemplary embodiment of a page buffer constructed in accordance with the present invention.

FIG. 2 shows an exemplary embodiment of a page buffer 200 constructed in accordance with the present invention. The page buffer 200 includes a bit line (BL) 202 terminal that couples to one of the bit line terminals of a NAND core cell, for example, the core cell shown in FIG. 1. For example, each of the BL lines in FIG. 1 (i.e., BL1, BL2, BL3, etc.) are coupled to their own respective page buffer that is constructed like the page buffer 200.

The page buffer 200 is further coupled to a power terminal (Vcc) and a data terminal 204. A PBIAS terminal is used for biasing the page buffer during sensing modes. A PGMON terminal is used for setting programming modes. A SET terminal is used for setting a sensing result. A BLCNTL terminal is for bit line control. A DIS terminal 210 is used for coupling the BL 202 to ground.

The page buffer 200 also includes a latch 206 that latches a data value for temporary storage. The latch 206 is coupled to a gate terminal of transistor 208. The transistor 208 operates to selectively control the operation of the DIS terminal 210 by controlling whether or not the BL line can be coupled to ground by operation of the DIS terminal 210. For example, if transistor 208 is in an open state, operation of the DIS terminal.cannot couple the BL line to ground.

During data loading operations, the page buffer 200 accepts data for storage. The latch 206 of the page buffer is set to a high level "1", thereby closing transistor 208 so that the BL can be coupled to GND via operation of the DIS terminal during programming. After the data loading, the programming algorithm is started and the device is programmed. The device then moves to the verify mode.

Figure 3:
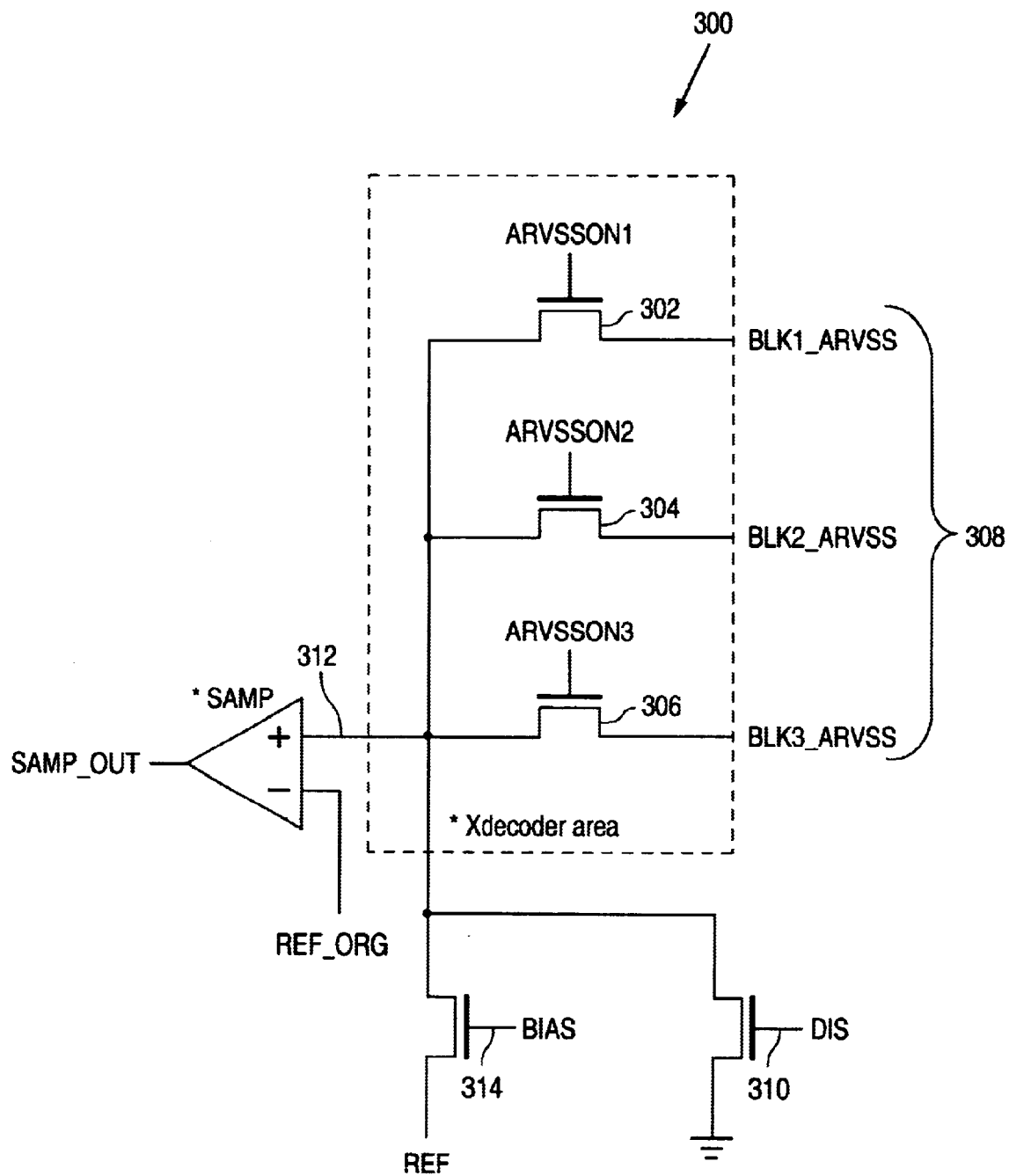
FIG. 3 shows one embodiment of a portion of an Xdecoder constructed in accordance with the present invention.

FIG. 3 shows one embodiment of an ARVSS portion 300 of an Xdecoder constructed in accordance with the present invention. The ARVSS portion 300 includes transistors 302, 304, 306 that provide signal paths allowing block signals 308 to be individually coupled to a sense amplifier (SAMP). The sense amplifier (SAMP) includes an output terminal referred to as SAMP_OUT. A DIS terminal 310 is coupled to a transistor that operates to pull a positive terminal 312 of the SAMP to ground. The Xdecoder also includes a BIAS terminal 314 coupled to a transistor that operates to couple a reference signal (REF) to the positive terminal 312 of the SAMP. A negative terminal 316 of the SAMP is coupled to a second reference signal (REF_ORG). The gates of transistors 302, 304 and 306 are controlled by control lines referred to as ARVSSONx control lines. These control lines are activated to allow block signals 308 to be coupled to the SAMP.

Figure 4:
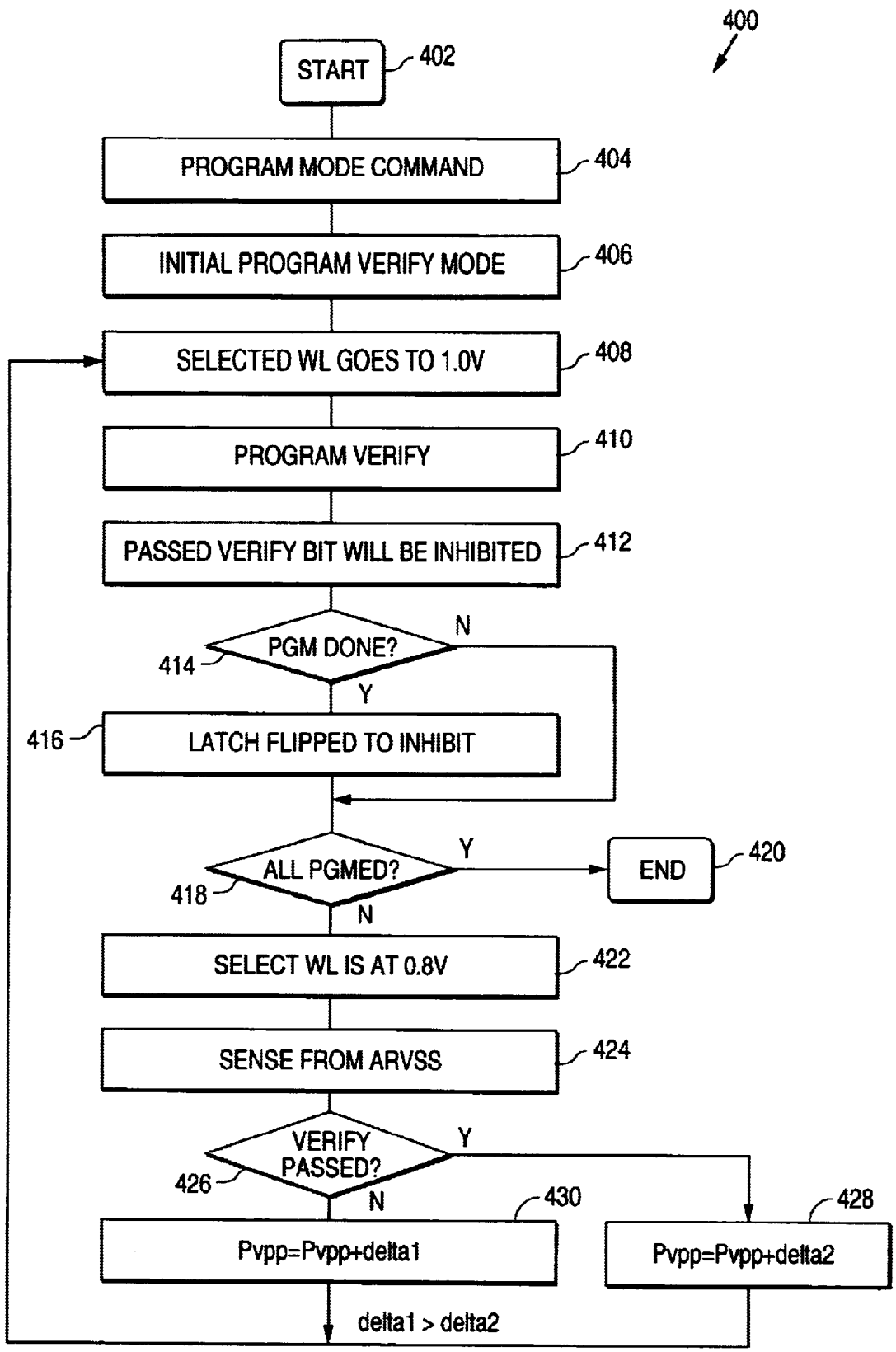
FIG. 4 shows a flow diagram of a program verify method in accordance with the present invention.

FIG. 4 shows a flow diagram 400 illustrating one embodiment of a program verify method for use with a memory device in accordance with the present invention. The method starts at block 402, and at block 404, a programming mode command begins the initial programming process for the memory device.

At block 406, after the initial programming, a program verify mode begins. The verify mode is used to verify that memory cells of the memory device have been properly programmed to have the correct Vt levels. At block 408, assuming the programmed Vt is determined to be more than 1.0 volt, the selected word line is set at 1.0 volt to perform the verify operation.

At block 410, a verify operation is performed to determine passed bits that have been successfully programmed with the correct Vt levels. At block 412, for the passed bits, the latch 206 of the page buffer 200 turns to inhibit. As a result, the gate of transistor 208 is set to low, thereby opening transistor 208 and preventing the BL from being pulled to ground by the operation of the DIS terminal 210. thus, further programming of those bits is prevented.

At block 414, a test is performed to see if programming for each page buffer is complete. If programming for each page buffer is not complete, the method proceeds to block 418. If programming for each page buffer is complete, the method proceeds to block 416.

At block 416, if the programming for each page buffer is complete, the latch is flipped to inhibit further programming. At block 418, a test is performed to determine if all bits are programmed correctly. If so, the method ends at block 420. If not all bits are programmed correctly, then the method proceeds to block 422.

At block 422, the word line voltage is set at 0.8 volts, which is lower than initial verify voltage. At block 424, during the next verify operation, sensing is carried out from ARVSS side. If the ARVSS is kept at high level, then any failed bits have a Vt level more than 0.8 volts. When operation moves to re-programming, the programming pulse is changed to weaken its characteristics. For example, the pulse width becomes shorter or the pulse height becomes smaller and so on.

At block 426, a test is performed to determine if the verify has passed all bits. If the verify has passed, then the method proceeds to block 428 where the programming pulse is changed to a new level and additional programming occurs. For example, the programming pulse is made slightly stronger. If the verify fails, then the method proceeds to block 430 where the programming pulse is set to another strength and additional programming occurs. For example, the strength of the programming pulse is increased more at block 430 than at block 428, so that delta1>delta2. After performing additional programming at either block 428 or 430, the method proceeds to block 408 where another verify operation occurs with the WL voltage set to 1.0 volts. From this point forward, the failed bits are verified again using the new WL setting. Thus, the exemplary method of FIG. 4 operates to verify bits have the desired Vt level, and reprogram only failed bits using adjustable programming pulse strength so as to avoid overstressing the bits and to realize a very narrow Vt distribution.

Conventional methods cannot identify the failed bits' Vt levels as done in the present invention. Therefore, it is not possible to adjust the programming strength to reduce the Vt distribution. If two metal layers are used on the core cell, the ARVSS node can be separated as each block operation. The advantage is important because of the large resistance, the ARVSS driver can be smaller.

One or more embodiments of the present invention provide several advantages over conventional circuits. For example, one advantage is that only failed bits are verified by the lower WL level, which means that additional programming strength can be changed to a weaker level. Another advantage is that the resulting programmed Vt distribution is narrower than in conventional methods. Thus, embodiments of the invention are suitable for use with multi-level cell (MLC) devices, because the multilevel distribution is related to cell endurance. If the Vt distribution is wide, then it is possible to have an overlap of data states, for example, during cycling or retention bake and so on. Thus, one or more embodiments included in the present invention make it possible create Vt windows between data states. Basically, during the verify time, the sequence determines the next pulse height based on core behavior. To have even narrower Vt distribution, it is possible to apply a lower voltage to the WL (approximately 0.5 volts), otherwise, 0.8 volts may be used.

This method can achieve a selected Erase Vth distribution also. During erase verify, the ARVSS is forced to 0.6 volts first and then, the ARVSS mode is changed to approximately 0.5 volts. If the ARVSS node is lower than 0.5 volts, the second erase pulse does not need to be increased or forced on for a long time.

The present invention includes a system for programming verification that intelligently reprograms failed bits in a memory device with a reduced programming strength to avoid excessively stressing the device. The embodiments described above are illustrative of the present invention and are not intended to limit the scope of the invention to the particular embodiments described. Accordingly, while several embodiments of the invention has been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. A method for performing program verification of memory cells in a NAND memory device to achieve selected Vt levels, the NAND memory device includes page buffers having disable gates that operate to enable or disable the method comprising steps of:

(a) performing a programming cycle to program the memory cells to have the selected Vt levels;

(b) setting a first verification level;

(c) verifying that the memory cells have the selected Vt levels using the first verification level, wherein passed and failed memory cells are determined;

(d) inhibiting, using the disable gates, the passed memory cells from further programming;

(e) setting a second verification level;

(f) verifying that the failed memory cells have a second selected Vt level using the second verification level, wherein second passed and second failed memory cells are determined;

(g) adjusting a programming pulse to have a first strength level when the second passed memory cells are determined;

(h) adjusting the programming pulse to have a second strength level when the second failed memory cells are determined;

(i) re-programming the failed memory cells with the programming pulse; and (j) repeating steps (b) through (i) above until the memory cells have the selected Vt levels.

2. The method of claim 1, wherein the second strength level is greater than the first strength level.

3. The method of claim 1, wherein the first verification level is 1.0 volts.

4. The method of claim 3, wherein the second verification level is 0.8 volts.

5. The method of claim 1, wherein the NAND memory device is a multilevel cell (MLC) device.

6. Apparatus for performing program verification in a NAND memory device, the apparatus comprising:

a page buffer coupled to a bit line, the page buffer including a latch coupled to a data input, the latch producing a program-inhibit signal; and a programming disable gate connected to said bit line, the program disable gate coupled to ground, said programming disable gate is further coupled to receive the program-inhibit signal, wherein when the program-inhibit signal indicates that further programming is inhibited, said programming disable gate does not enter a conductive state, and when the program-inhibit signal indicates that further programming is needed, said programming disable gate enters the conductive state.

7. The apparatus of claim 6, wherein the programming disable gate is a transistor.

8. The apparatus of claim 6, wherein the NAND memory device is a multilevel cell (MLC) device.

* * * * *